(12) United States Patent
Vimercati

(10) Patent No.: US 10,958,271 B1
(45) Date of Patent: Mar. 23, 2021

(54) OUTPUT BUFFER HAVING SUPPLY FILTERS

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/922,894

(22) Filed: Jul. 7, 2020

(51) Int. Cl.
*H03K 19/003* (2006.01)
*G11C 7/10* (2006.01)
*H03K 19/0185* (2006.01)

(52) U.S. Cl.
CPC ..... *H03K 19/00384* (2013.01); *G11C 7/1057* (2013.01); *H03K 19/00315* (2013.01); *H03K 19/00361* (2013.01); *H03K 19/018521* (2013.01)

(58) Field of Classification Search
CPC ....... H03K 19/00384; H03K 19/00315; H03K 19/00361; H03K 19/018521; G11C 7/1057
See application file for complete search history.

(56) References Cited

U.S. PATENT DOCUMENTS

| | | | | |
|---|---|---|---|---|
| 4,961,010 A | * | 10/1990 | Davis | H03K 19/00361 326/27 |
| 7,786,761 B2 | * | 8/2010 | Lin | G11C 7/04 326/82 |
| 2004/0041607 A1 | * | 3/2004 | Pan | H03K 19/00384 327/170 |
| 2014/0103962 A1 | * | 4/2014 | Ajram | H03K 19/00361 327/108 |

* cited by examiner

*Primary Examiner* — Daniel D Chang
(74) *Attorney, Agent, or Firm* — Schwegman Lundberg & Woessner, P.A.

(57) ABSTRACT

An electronic device may include one or more output buffers each including a pair of final p-channel metal oxide semiconductor (PMOS) and n-channel metal oxide semiconductor (NMOS) transistors, a first pre-buffer to drive the PMOS transistor, and a second pre-buffer to drive the NMOS transistor. Each output buffer receives power from a pre-buffer supply filtering circuit, which may include a supply capacitor for stabilizing supply voltage, a low-pass first pre-buffer supply filter to filter the voltage supplied to the first pre-buffer, and a low-pass second pre-buffer supply filter the voltage supplied to the second pre-buffer.

20 Claims, 13 Drawing Sheets

US 10,958,271 B1

OUTPUT BUFFER HAVING SUPPLY FILTERS

BACKGROUND

Data input/output frequency in electronic devices has been continuously increasing, challenging the capability of output buffers in maintaining signal integrity. Changes of data state at high frequencies may cause the output resistance of an output buffer and the supply voltage applied to the output buffer to vary to an extent of undermining accuracy of the output data. Techniques for improving the output buffer capabilities have been developed, such as keeping the output resistance of the output buffer as constant as possible and/or using a large capacitance to stabilize the supply voltage applied to the output buffer.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

Figure 1:
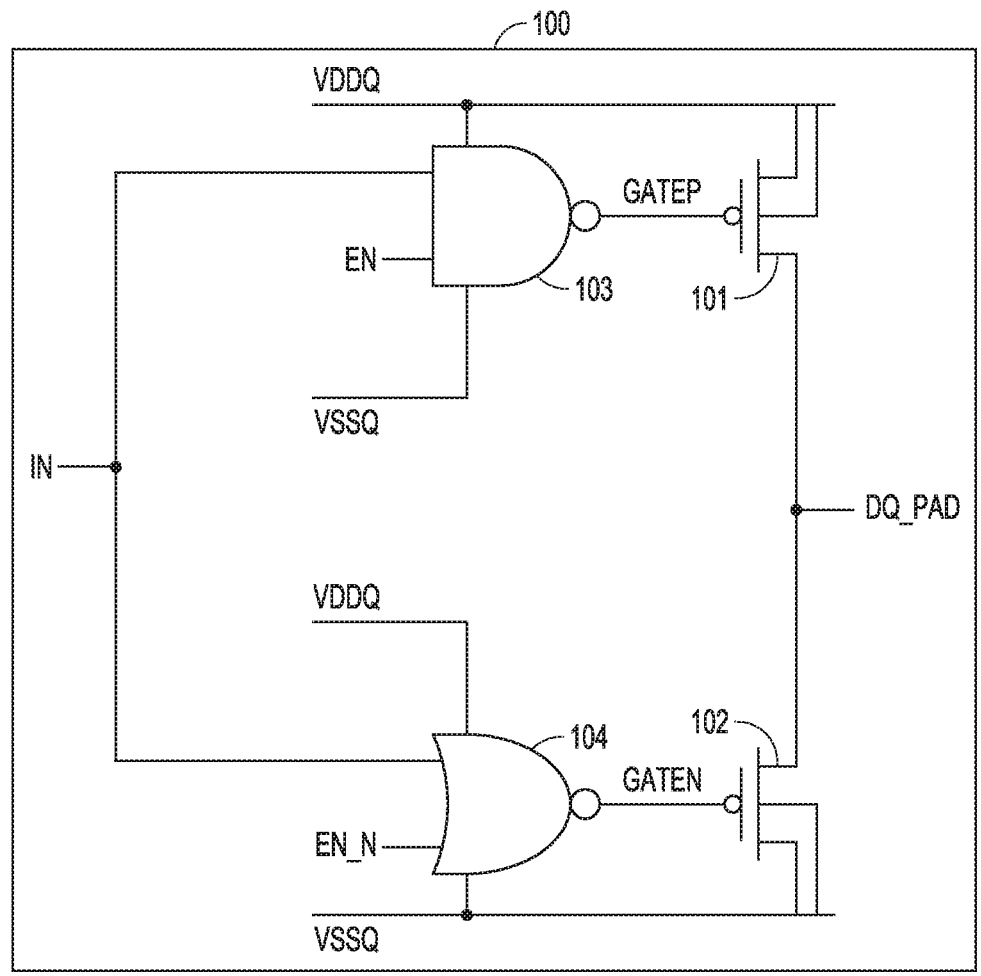
FIG. 1 is a circuit diagram illustrating an example of an output buffer.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. References to "an", "one", or "various" embodiments in this disclosure are not necessarily to the same embodiment, and such references contemplate more than one embodiment. The following detailed description provides examples, and the scope of the present invention is defined by the appended claims and their legal equivalents.

This document relates to method and apparatus for stabilizing supply voltage for pre-buffers that drive final transistors of an output buffer in an electronic device. The output buffer includes a pair of final NMOS and PMOS transistors and a pair of pre-buffers each driving one of the final NMOS and PMOS transistors. A capacitor having a sufficiently large capacitance coupled between voltage supply lines (e.g., VDD and VSS) for the output buffer has been used to improve the capability of the output buffer in ensuring integrity of digital signals at high frequencies. The present subject matter provides the output buffer with pre-buffer voltage supply filtering to further improve that capability by stabilizing the gate voltage of each of the final NMOS and PMOS transistors. For example, instead of using a total capacitance between the voltage supply lines for the entire output buffer, the present subject matter uses a portion of the total capacitance for filtering the voltage supplied to the pre-buffer that drives the final NMOS transistor and another portion of the total capacitance for filtering the voltage supplied to the pre-buffer that drives the final NMOS transistor, in addition to the remaining portion of the total capacitance that is coupled between the voltage supply lines. This improves the capability of the output buffer without requiring additional total capacitance (i.e., without requiring additional space on the electronic device). By stabilizing the supply voltages to the pre-buffers, the variance of gate voltage (Vgs) of the final NMOS and PMOS transistors are reduced, resulting in better signal integrity at the output pad connected to the output buffer.

One example of the electronic device includes a memory device. Many forms of memory devices may be used in a system while limiting data processing speed of the system because of limitations on how quickly data can be read from and/or write into the memory devices without compromising accuracy. Such memory devices may include, by way of non-limiting example only, both volatile and non-volatile memory. Volatile memory requires power to maintain its data, and includes random-access memory (RAM), in various forms, such as dynamic random-access memory (DRAM) or synchronous dynamic random-access memory (SDRAM), among others. Non-volatile memory may retain stored data when not powered, and may include one or more storage technologies, such as flash memory (e.g., NAND or NOR flash), electrically erasable programmable ROM (EEPROM), static RAM (SRAM), Ferroelectric RAM (Fe- RAM), erasable programmable ROM (EPROM), resistance variable memory, such as phase-change random-access mentor), (PCRAM), resistive random-access memory (RRAM), magnetoresistive random-access memory (MRAM), or 3D XPoint™ memory, among others. The present subject matter can be applied, by way of example, but not by way of restriction, to such memory devices to increase the maximum frequency at which the system can operate. In various embodiments, the present subject matter can be applied in any electronic device with CMOS circuitry for increasing operational speed and/or improving signal integrity.

Some terms/acronyms used in this document, including the drawings, include:

NMOS transistor: n-channel metal-oxide-semiconductor field-effect transistor (MOSFET);
PMOS transistor: p-channel metal-oxide-semiconductor field-effect transistor (MOSFET);
IN: data input (into output buffer);
DQ: data output (from output buffer);
GATEP: gate of PMOS transistor;
GATEN: gate of PMOS transistor;
VDD: drain supply voltage;
VSS: source supply voltage;
VDDQ: output stage drain supply voltage;
VSSQ: output stage source supply voltage;
VDDQ_BALL: output stage drain supply voltage at a position corresponding to a solder ball in a ball grid array (BGA) package;
VSSQ_BALL: output stage source supply voltage at a position corresponding to a solder ball in a BOA package;
VDD_FILT: filtered output stage drain supply voltage;
VSSQ_FILT: filtered output stage source supply voltage;
EN: enable signal;
EN_N: disable signal (enable signal inverted);
GND_PKG: packaging ground;
VDDQ_PAD: output stage drain supply voltage pad;
VSSQ_PAD: output stage source supply voltage pad;
DQ_PAD: data output pad.

FIG. 1 is a circuit diagram illustrating an example of an output buffer 100. Output buffer 100 includes a pair of final transistors including a PMOS transistor 101 and an NMOS transistor 102 with their drains coupled to the data output pad (DQ_PAD). A NAND gate functioning as a pre-buffer 103 drives the PMOS transistor 101. A NOR gate functioning as a pre-buffer 104 drives the PMOS transistor 101. When the enable signal (EN) is high (i.e., EN_N is low), output buffer 101 functions as a noninverting buffer that drives the input (IN) data onto the DQ_PAD. When EN is low (i.e., EN_N is high), PMOS transistor 101 and NMOS transistors 102 are disconnected from the IN, Thus, EN allows multiple output buffers to be connected on the same bus by enabling only one of the multiple output buffers at a time.

In the illustrated example, the pair of final transistors 101 and 102, pre-buffer 103, and pre-buffer 104 are powered using an output stage drain supply voltage (MIX)) and an output stage source supply voltage (VSSQ). As discussed below, the stability of VDDQ and VSSQ limits the data speed that output buffer 100 can accommodate. The present subject matter provides for improvement of a measure of data quality and/or reduced total capacitance required for a minimum value for the measure of data quality.

Figure 2:
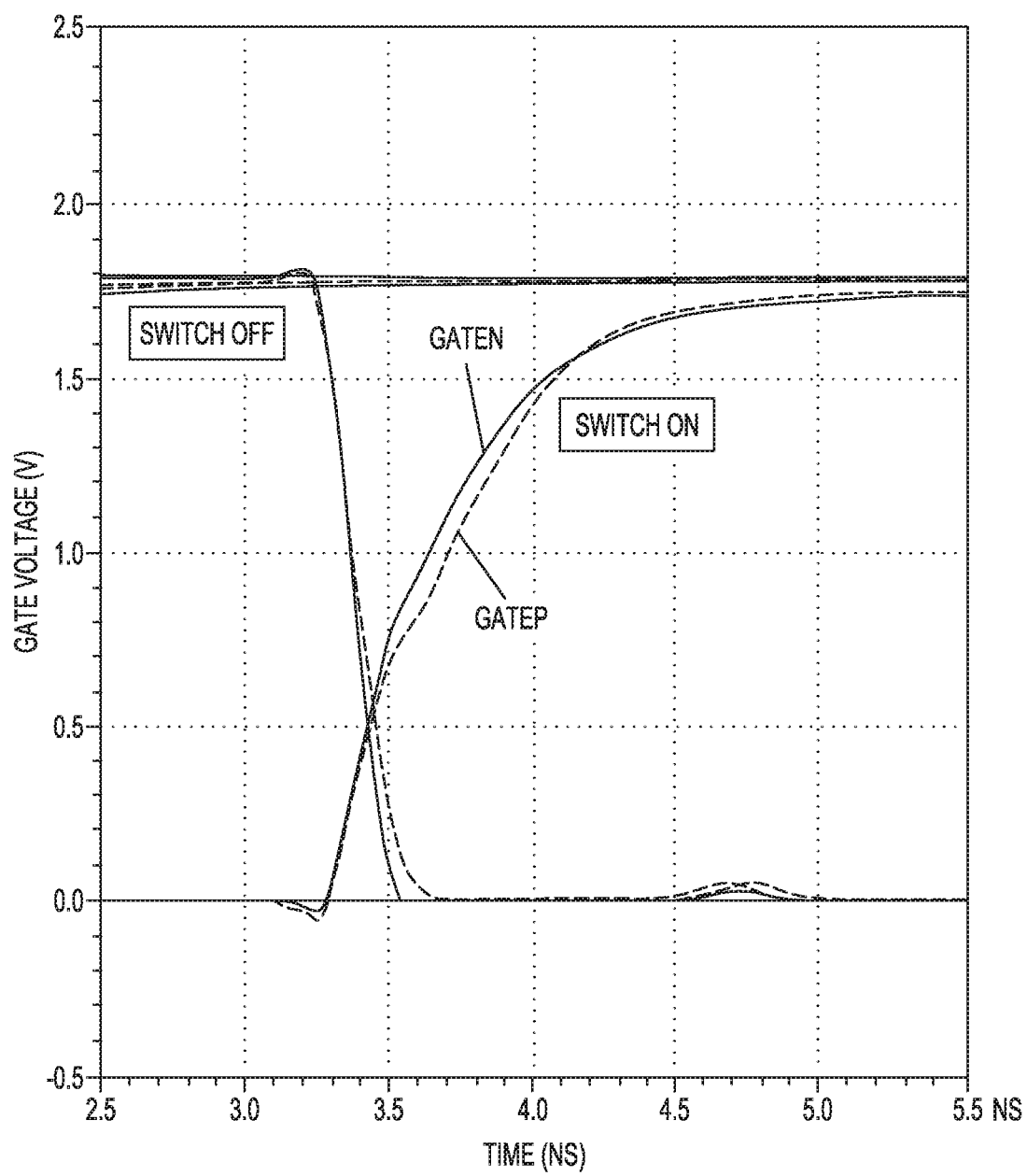
FIG. 2 is a graph showing an example of gate voltages of final transistors in the output buffer of FIG. 1.

FIG. 2 is a graph showing an example of gate voltages of the final transistors output buffer 100. The gate voltage (i.e., the gate-to-source voltage, Vgs) for PMOS transistor is measured at the gate of the PMOS transistor (GATEP) with reference to VDDQ (flipped as shown in the graph). The gate voltage (i.e., the gate-to-source voltage, Vgs) for NMOS transistor is measured at the gate of the NMOS transistor (GATEN) with reference to VSSQ. MOS transistors generate electromagnetic interference at levels that increase with the slew rate of the output current (I, as measured at DQ_PAD). In order to limit the slew rate (dI/dt), the switching-on time for the final transistors is controlled, and therefore the Vgs for each of PMOS transistor 101 and NMOS transistor 102 is controlled for rising at a desired speed.

Figure 3:
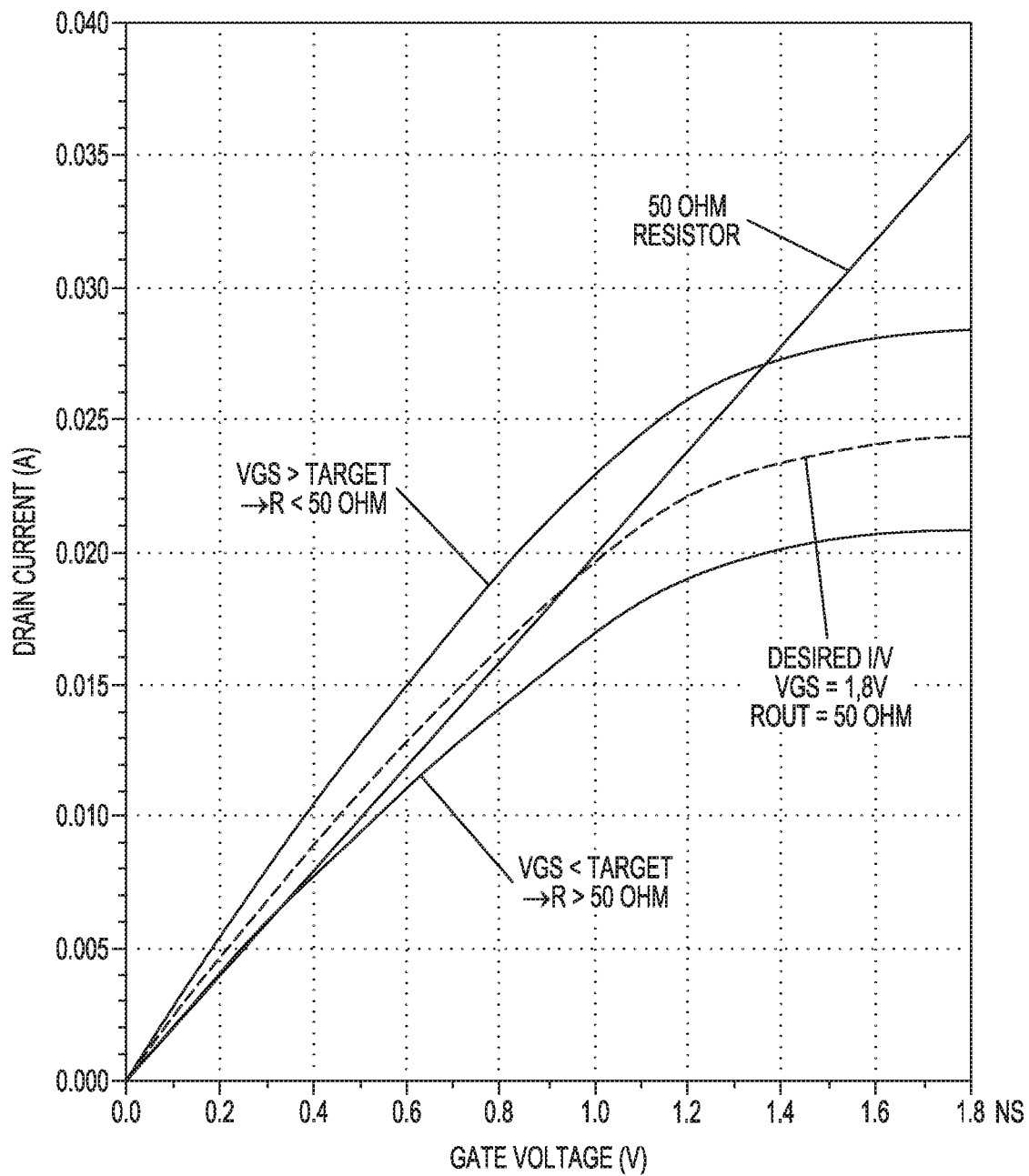
FIG. 3 is a graph showing an example of current-voltage characteristics of a metal oxide semiconductor (MOS) transistor.

FIG. 3 is a graph showing an example of current-voltage (I-V) characteristics of a MOS transistor. FIG. 3 shows curves (when VDDQ is 1.8 V) corresponding to the following cases:

an ideal case with the final transistor having a linear output resistance (i.e., having the characteristics of a resistor) being a target resistance (e.g., R=50 ohm), which is only true for a fixed Vgs (e.g., 1.8 V);
a case with the final transistor having an output resistance approximating the linear output resistance being the target resistance (e.g., R=50 ohm) in the 0-VDDQ/2 range with a fixed. Vgs (e.g., Vgs=1.8 V), which is only true for a fixed Vgs (e.g., 1.8 V);
a case in which when Vgs increases (e.g., Vgs>1.8 V), the curve shifts up, changing the drain resistance of the final transistor which has a resistance smaller than the target resistance (e.g., R<50 ohm); and
a case in which when Vgs decreases (e.g., Vgs<1.8 V), the curve shifts down, changing the drain resistance of the final transistor which has a resistance larger than the target resistance (e.g., R>50 ohm).

These curves show that the Vgs of a final transistor needs to be kept constant because a MOS device has a certain drain characteristic only at a certain Vgs. Thus, for output buffer 100, a large amount of capacitance can be dedicated to filtering the supply voltages in an attempt to keep the Vgs of each of PMOS transistor 101 and NMOS transistor 102 as constant as possible, such that each of these final transistors has an output resistance approximating the linear output resistance being the target resistance (e.g., R=50 ohm) in the 0-VDDQ/2 range.

While VDDQ of 1.8 V is used in the simulations discussed with results presented in this document as an example for illustration and demonstration, the present subject matter can be applied to any supply voltage range. In various embodiments, VDDQ can be any voltage suitable for powering a memory device (e.g., any voltage in the range of 0.5 V to 5 V).

Figure 4:
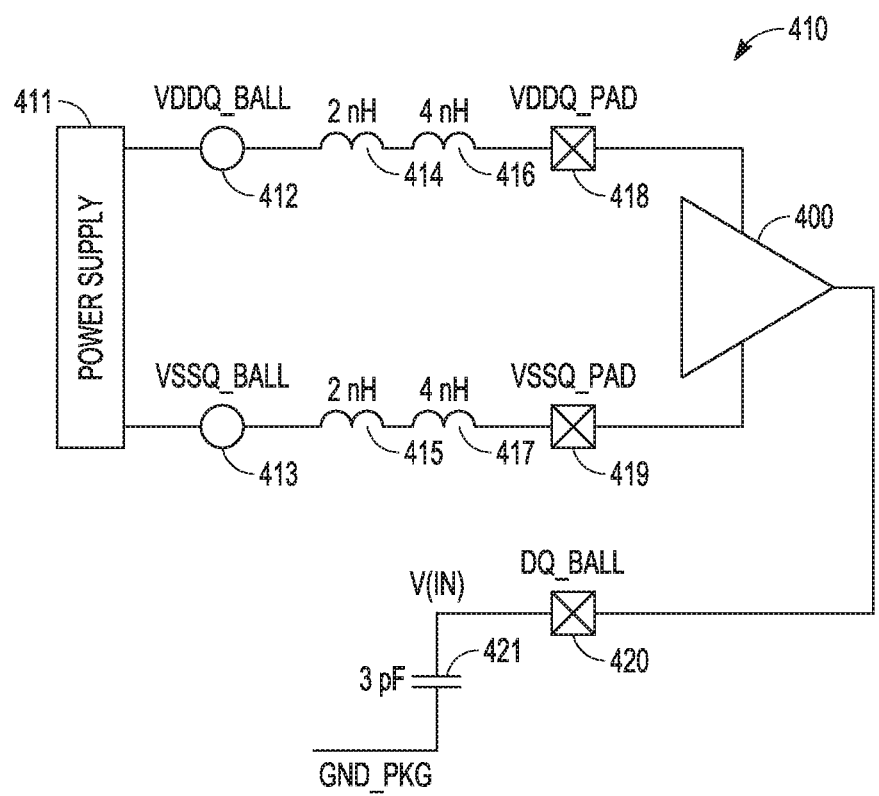
FIG. 4 is a circuit diagram illustrating an example of an output stage circuit coupled to a power supply.

FIG. 4 is a circuit diagram illustrating an example of an output stage circuit 410 coupled to a power supply 411. Circuit 410 includes one or more output buffers 400. Circuit 410 can be used to run simulations for analyzing various designs aimed at improving signal integrity at a data output. For purpose of simulations that generate results illustrated in FIGS. 5-9, one or more output buffers 400 are each a circuit of output buffer 100. For the simulations, the "ideal case" refers to the case in which one or more output buffers 400 include a single output buffer 100. To simulate a practical case, one or more output buffers 400 include multiple output buffers each being one output buffer 100. To each output buffer 400 being analyzed, the other output buffers are referred to as aggressors as they generate electromagnetic interferences affecting the performance of the output buffer being analyzed.

In the illustrated example, circuit 410 includes a power supply 411 to provide VDDQ and VSSQ (1.8 V and 0 V in the simulations). A VDDQ ball 412 represents the VDDQ connection point of a device that includes the illustrated circuit (with the "ball" referring to a solder ball in a ball grid array device package). VDDQ_BALL refers to the voltage at VDDQ ball 412. A VSSQ ball 413 represents the VSSQ connection point of the device. VSSQ_BALL refers to the voltage at VSSQ ball 413. Inductors 414, 415, 416, and 417 represent metal trace inductances. When the simulation includes multiple output buffers 400, inductor 414 (2 nH used for the simulation) represents the inductance between VDDQ ball 412 and a branching point where VDDQ_BALL supply lines to output buffers 400 branch out. Inductor 416 (4 nH used for the simulation) represents the inductance between branching point and VDDQ pads 418 coupled to output buffers 400. Inductor 415 (2 nH used for the simulation) represents the inductance between ball 413 and a branching point where VSSQ_BALL supply lines to output buffers 400 branch out. Inductor 417 (4 nH used for the simulation) represents the inductance between branching point and VSSQ pads 419 coupled to output buffers 400. When the simulation includes a single output buffer 400, inductor 414 (2 nH used for the simulations) and inductor 416 (4 nH used for the simulations) represent the inductance between VDDQ ball 412 and one VDDQ pad 418 coupled to the single output buffer 400. Inductor 415 (2 nH used for the simulations) and inductor 417 (4 nH used for the simulations) represent the inductance between VSSQ ball 413 and one VSSQ pad 419 coupled to the single output buffer 400. V(IN) represents the signal at DQ_PAD, the output of output buffer(s) 400, to be received by a signal receiver. A capacitor 421 (3 pF used for the simulations) represents the output capacitance at a data output pad (DQ_PAD). The data speed is controlled at 3.0 V/ns (350 ps turn-on time) for each of the PMOS and NMOS transistors in output buffer(s) 400.

Figure 5:
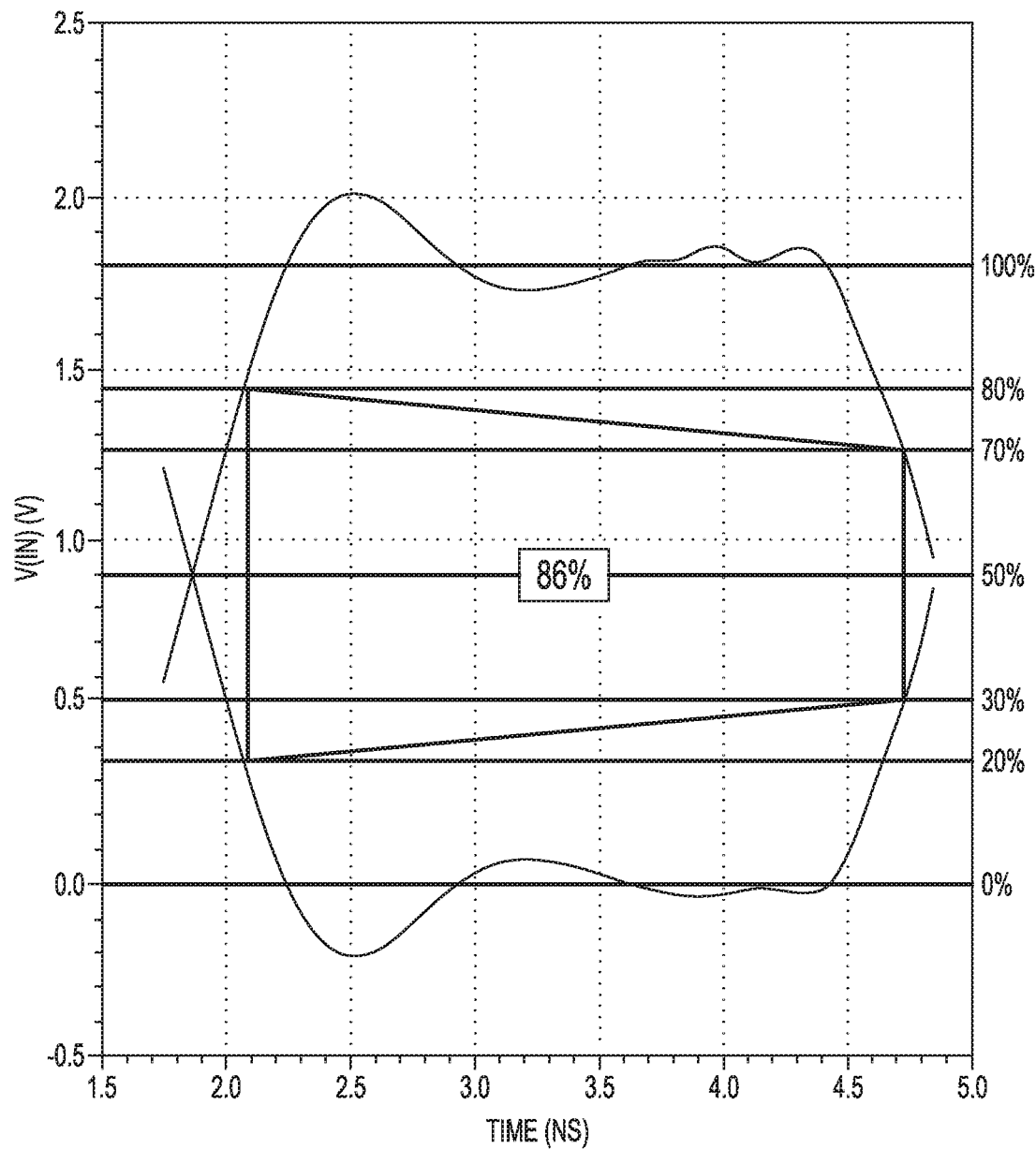
FIG. 5 is a graph showing an example of an eye-diagram of the voltage output from the output buffer, resulting from the simulation using the circuit of FIG. 4.

FIG. 5 is a graph showing an example of an eye-diagram of V(IN) resulting from the simulation using circuit 410 and power supply 411, with a single output buffer 400 (i.e., the ideal case). An "eye-diagram" (also known as "eye-pattern") is an oscilloscope-type display with the vertical input being a repetitively sampled digital signal and the horizontal sweep triggered by the data rate of the digital signal. An "eye-opening" in the eye diagram is indicative of signal-to-noise ratio (SNR) of a signal, with bigger eye-opening corresponding to higher SNR. One way to measure the eye-opening is to draw a trapezoid, as shown in FIG. 5. The trapezoid has a first base: between 20% and 80% of the voltage supply (VDDQ-VSSQ) and a second base between 30% and 70% of the voltage supply. A horizontal eye-opening percentage can be calculated by dividing the altitude of the trapezoid using the bit period (i.e., the reciprocal of the data rate). This horizontal eye-opening percentage represents the percentage of time during which the signal (a data bit) is sufficiently good. For the ideal case, the simulation shows that the horizontal eye-opening percentage is 86%.

Figure 6:
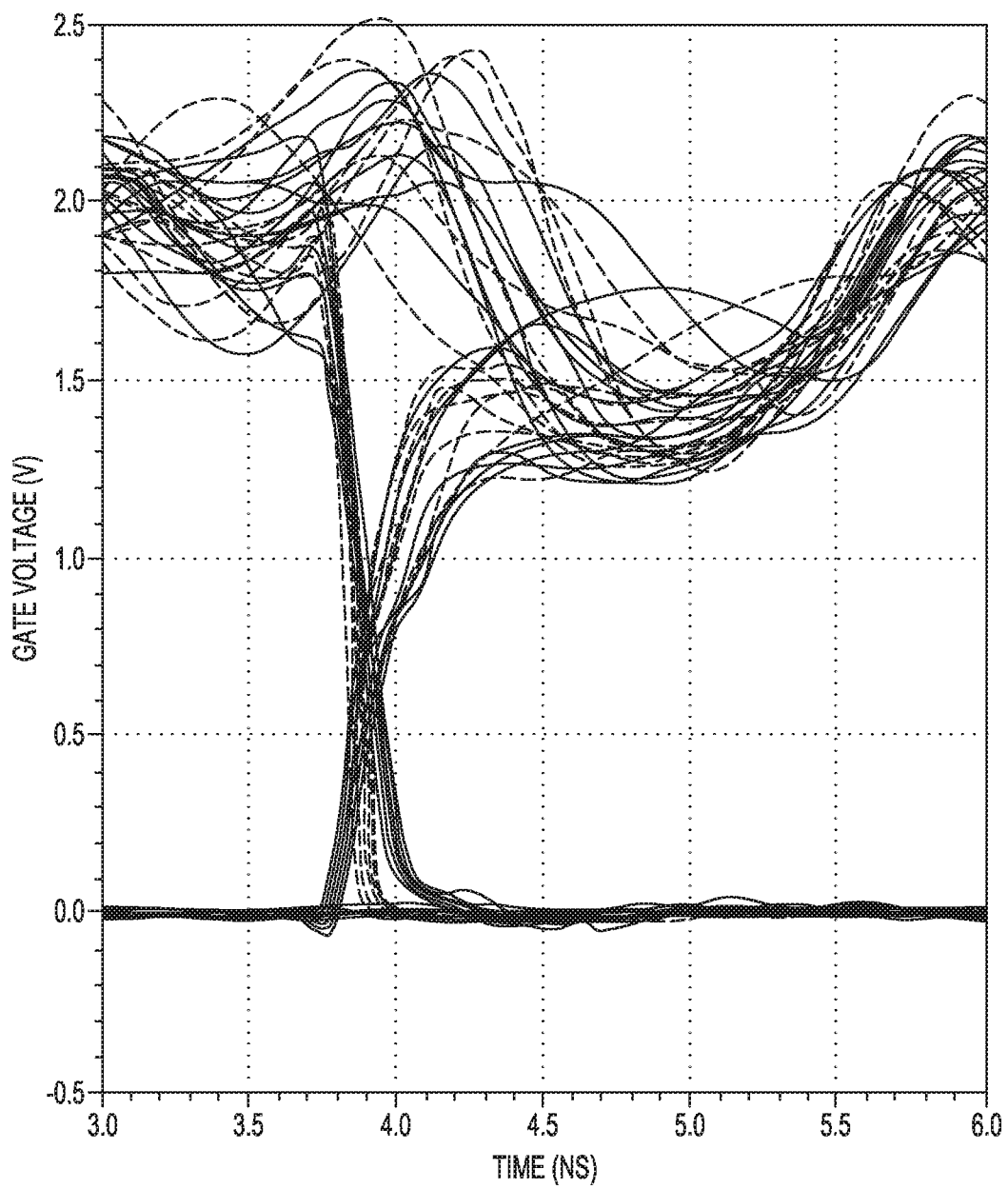
FIG. 6 is a graph showing an example of gate voltages of final transistors of multiple output buffers resulting from the simulation using the circuit of FIG. 4, without a capacitor coupled between voltage supply lines.
Figure 7:
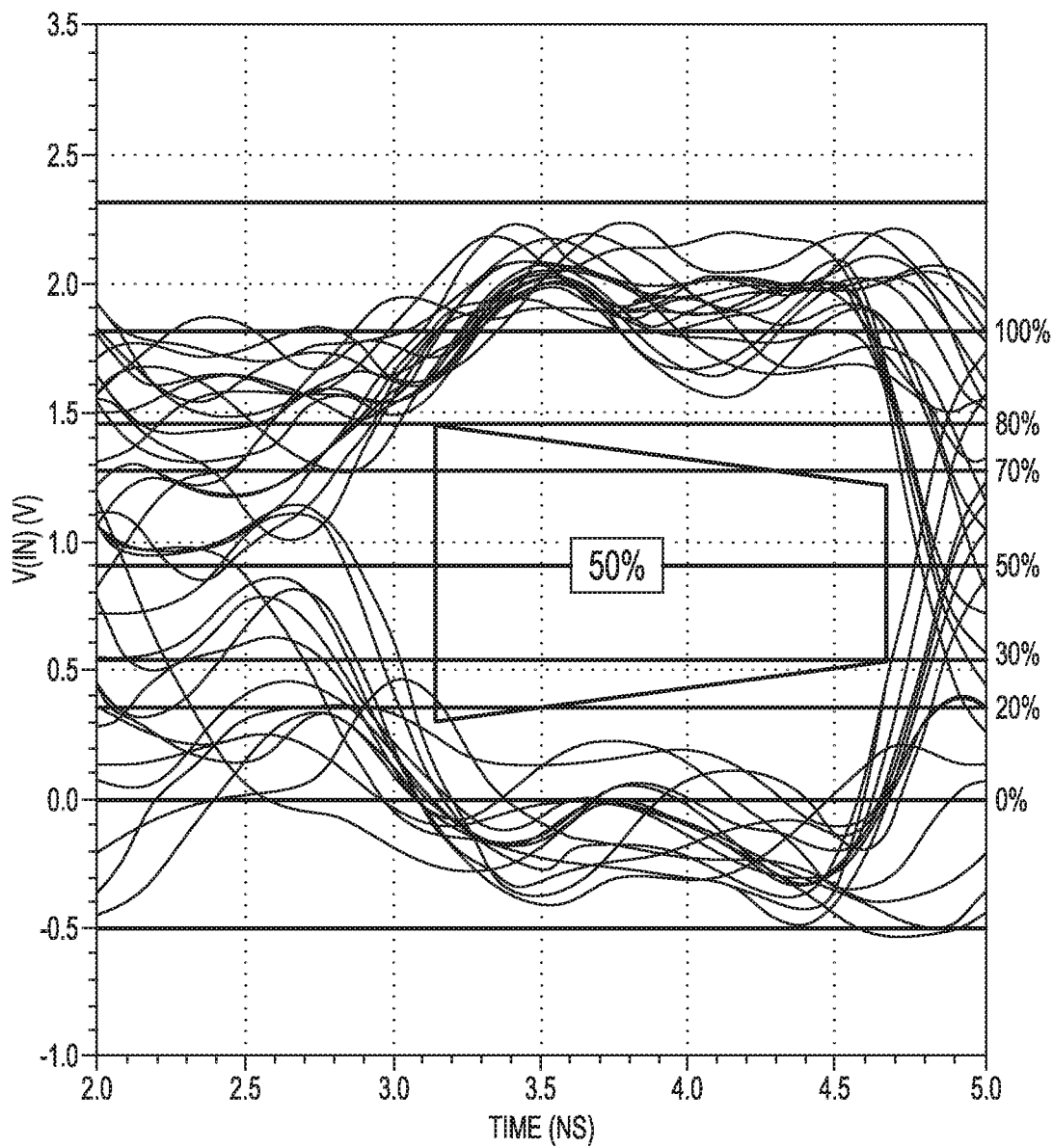
FIG. 7 is a graph showing an example of an eye-diagram of the voltage outputs from the multiple output buffers resulting from the simulation using the circuit of FIG. 4, without a capacitor coupled between voltage supply lines.

FIG. 6 is a graph showing an example of gate voltages of final transistors of multiple output buffers resulting from the simulation using circuit 410 and power supply 411, and FIG. 7 is a graph showing an example of the corresponding eye-diagram of VON). No capacitor is coupled between VDDQ and VSSQ lines. To simulate a practical case, a 16 output buffer 400 is included (i.e., 15 aggressors for each output buffer 400). The graphs in FIGS. 6 and 7 illustrate the problem in the practice case approximating the real environment of a device. The simulation shows that the horizontal eye-opening percentage is 50%.

Figure 8:
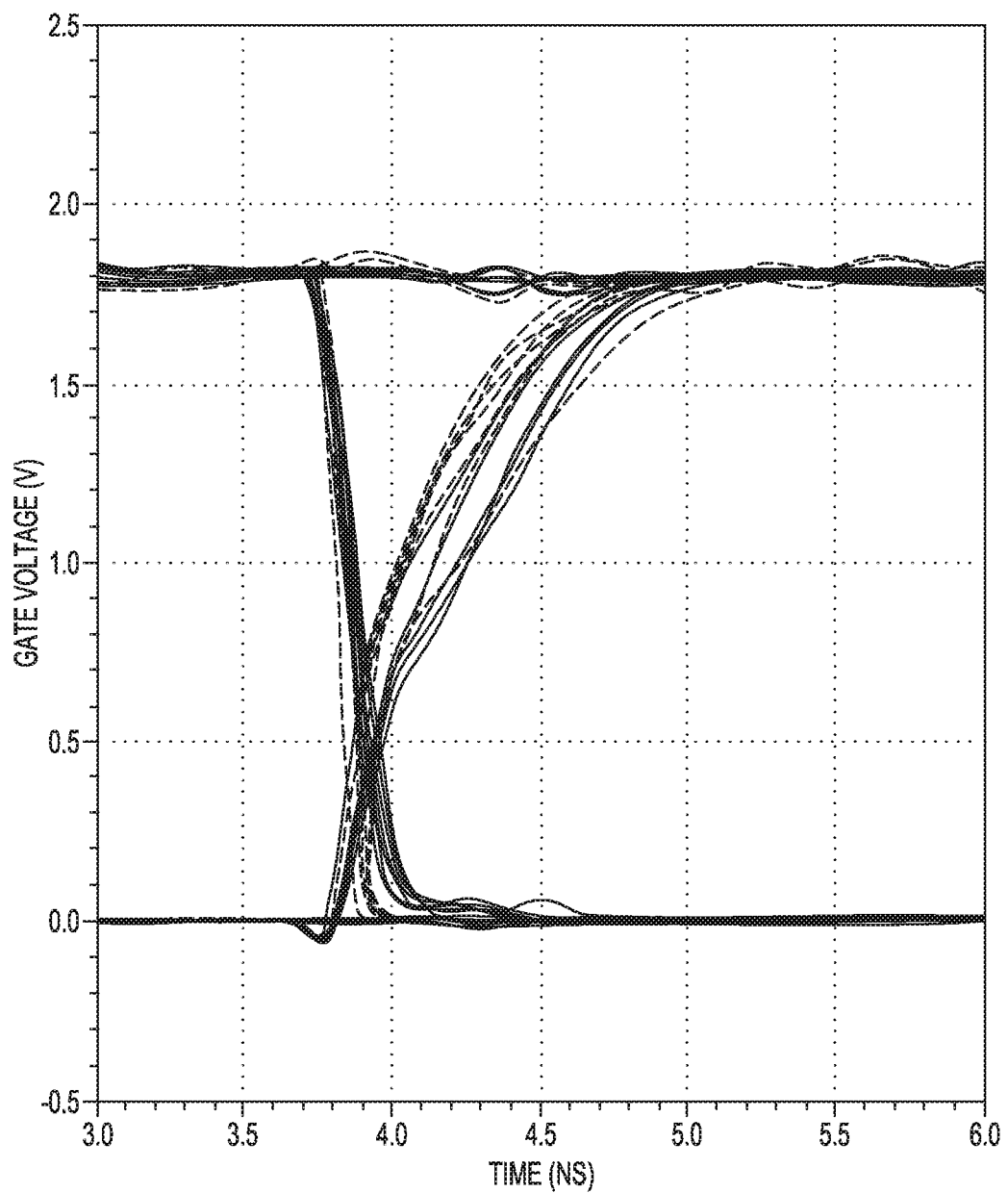
FIG. 8 is a graph showing an example of gate voltages of the final transistors of the multiple output buffers resulting from the simulation using the circuit of FIG. 4, with an ideal voltage source.
Figure 9:
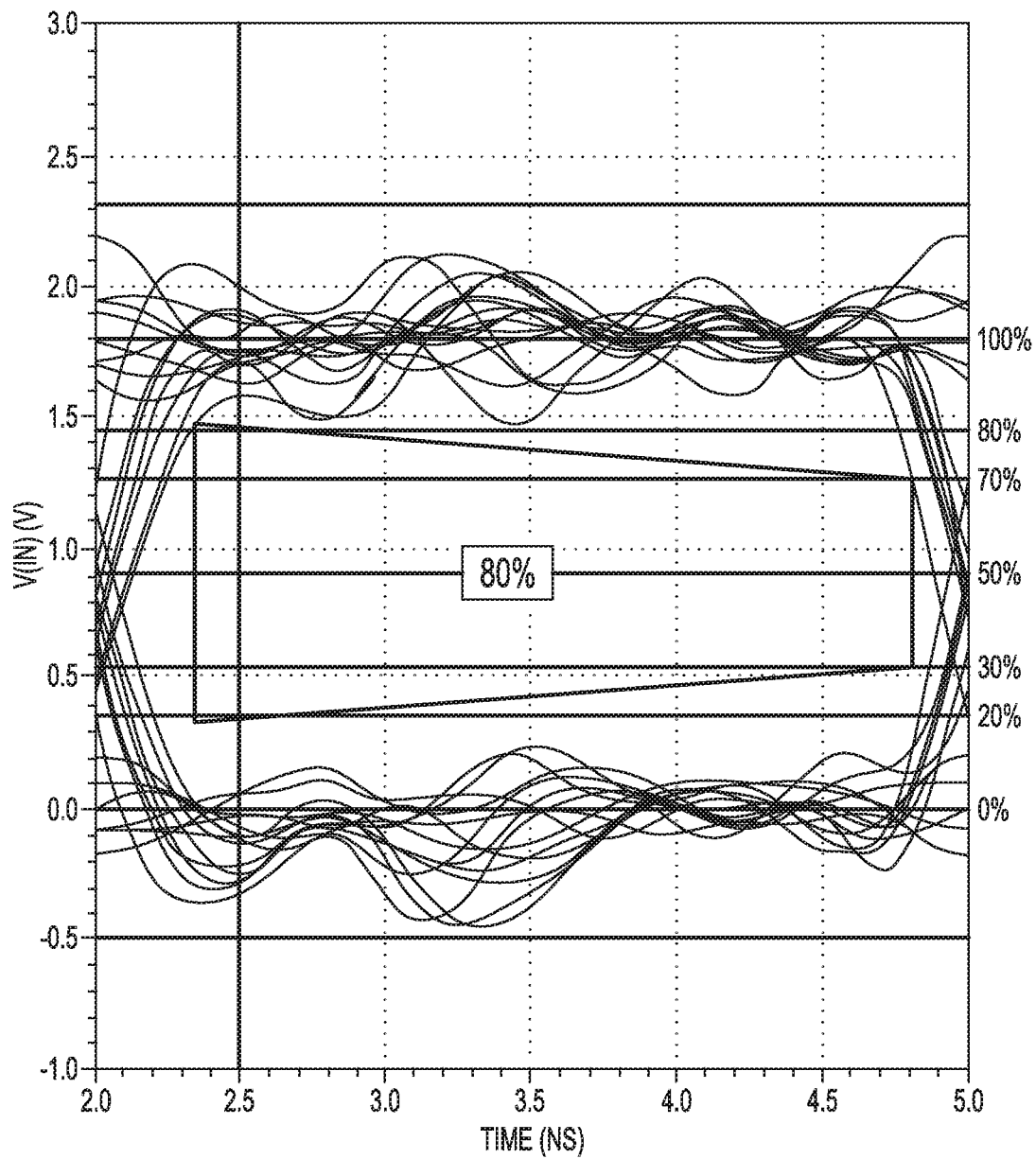
FIG. 9 is a graph showing an example of an eye-diagram of the voltage outputs from the multiple output buffers resulting from the simulation using the circuit of FIG. 4, with an ideal voltage source.

FIG. 8 is a graph showing an example of gate voltages of the final transistors of the multiple output buffers resulting from the simulation using circuit 410 and power supply 411 being an ideal voltage source, and FIG. 9 is a graph showing an example of the corresponding eye-diagram of V(IN), The difference between the simulation of FIGS. 6 and 7 and the simulation of FIGS. 8 and 9 is that latter uses an ideal voltage source that supplies constant voltages regardless of the variances in the load impedance that occur in practice, particular at high date rates. This ideal voltage source operates as if there is a capacitor having infinite capacitance coupled between VDDQ_BALL and VSSQ_BALL. The simulation shows that the horizontal eye-opening percentage is 80%.

It has been observed that the case with the ideal voltage source is very similar to a practice case in which a capacitor having a large capacitance is coupled between the voltage supply lines. It is possible to achieve the result as illustrated in FIG. 9 in practice by providing the large capacitance using a capacitor small enough to fit into an electronic device such as a memory device. The simulations have shown that a 100-pF capacitor coupled between VDDQ pad 418 and VSSQ pad 419 for each output buffer 400 provides results very similar to those shown in FIGS. 8 and 9.

The present subject matter can provide the same performance with capacitors having a total capacitance smaller than the large capacitance or a better performance with capacitors having a total capacitance equal to the large capacitance. For example, it provides for the same horizontal eye-opening percentage using a smaller total capacitance (and hence smaller space) or a higher horizontal eye-opening percentage using the same total capacitance.

Figure 10:
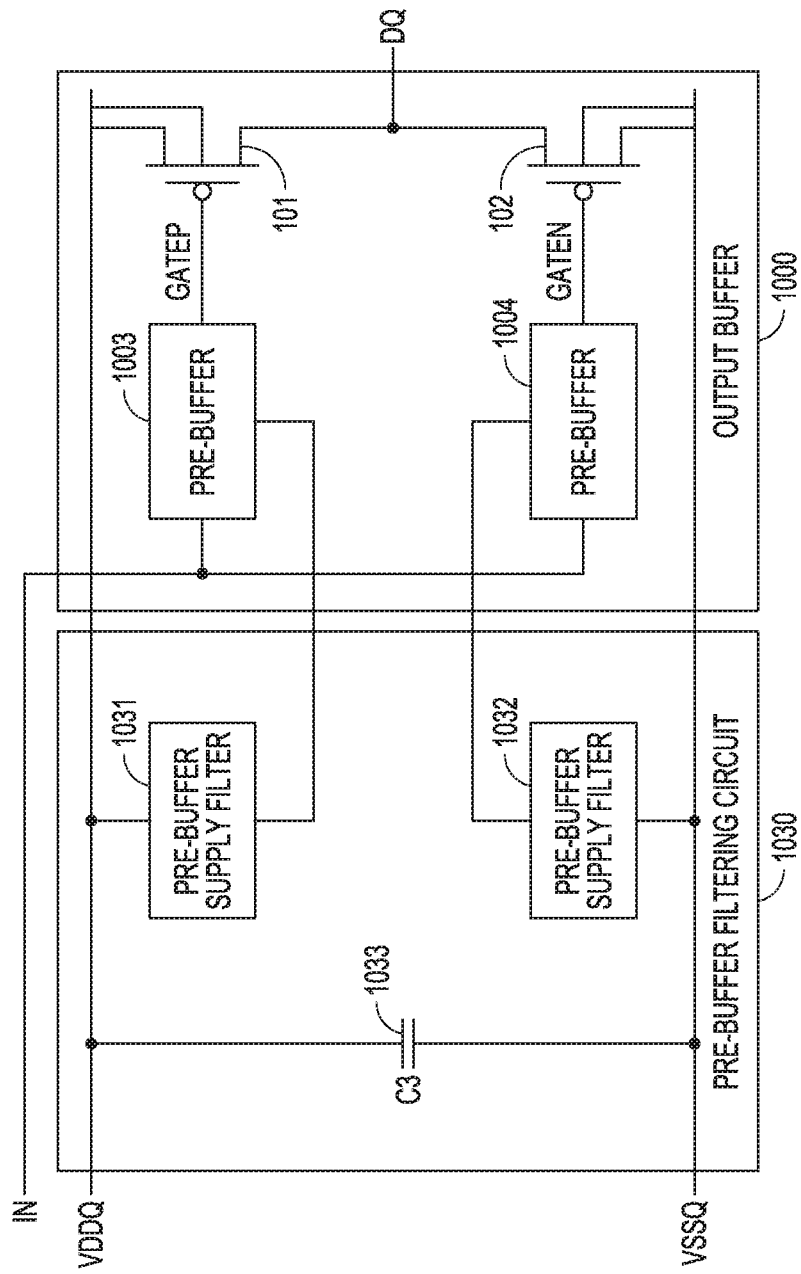
FIG. 10 is a block diagram illustrating an example of an output buffer and a pre-buffer filtering circuit.

FIG. 10 is a block diagram illustrating an example of an output buffer 1000 and a pre-buffer filtering circuit 1030. In various embodiments, output buffer 1000 and pre-buffer filtering circuit 1030 can be part of an electronic device such as a memory device. The electronic device can include multiple output buffers 1000. In one embodiment, one pre-buffer filtering circuit 1030 is used to supply power to each output buffer of the multiple output buffers 1000. In another embodiment, one pre-buffer filtering circuit 1030 is used to supply power to two or more output buffers of the multiple output buffers 1000. In yet another embodiment, one pre-buffer filtering circuit 1030 is used to supply power to all of the multiple output buffers 1000.

The portions of the electronic device illustrated in FIG. 10 includes a VDDQ node, a VSSQ node, pre-buffer supply filtering circuit 1030, and output buffer 1000. VDDQ and VSSQ refer to VDD (drain supply voltage) and VSS (source supply voltage), respectively, for the output stage of the electronic device that can be the same as or different from the VDD and VSS for other stages of the electronic device.

Pre-buffer supply filtering circuit 1030 can include a filtered VDDQ node, a filtered VSSQ node, a supply capacitor 1033 (C3) coupled between the VDDQ node and the VSSQ node, a pre-buffer supply filter 1031 coupled between the VSSQ node and the filtered VSSQ node, and a pre-buffer supply filter 1032 coupled between the VDDQ node and the filtered VDDQ node. Pre-buffer supply filters 1031 and 1032 are each a low-pass filter.

Output buffer 1000 can include a data input (IN) node, a data output (DQ) node, final PMOS transistor 101, final NMOS transistor 102, a pre-buffer 1003, and a pre-buffer 1004. PMOS transistor 101 has a PMOS source coupled to the VDDQ node, a PMOS drain coupled to the DQ node, and a PMOS gate. NMOS transistor 102 has an NMOS source coupled to the VSSQ node, an NMOS drain coupled to the DQ node, and an NMOS gate. Pre-buffer 1003 is coupled between the VDDQ node and the filtered VSSQ node to receive power, and coupled between the IN node the PMOS gate to drive PMOS transistor 101 using an input data signal. Pre-buffer 1004 is coupled between the filtered VDDQ node and the VSSQ node to receive power, and coupled between the IN node and the NMOS gate to drive NMOS transistor 102 using the input data signal.

Figure 11:
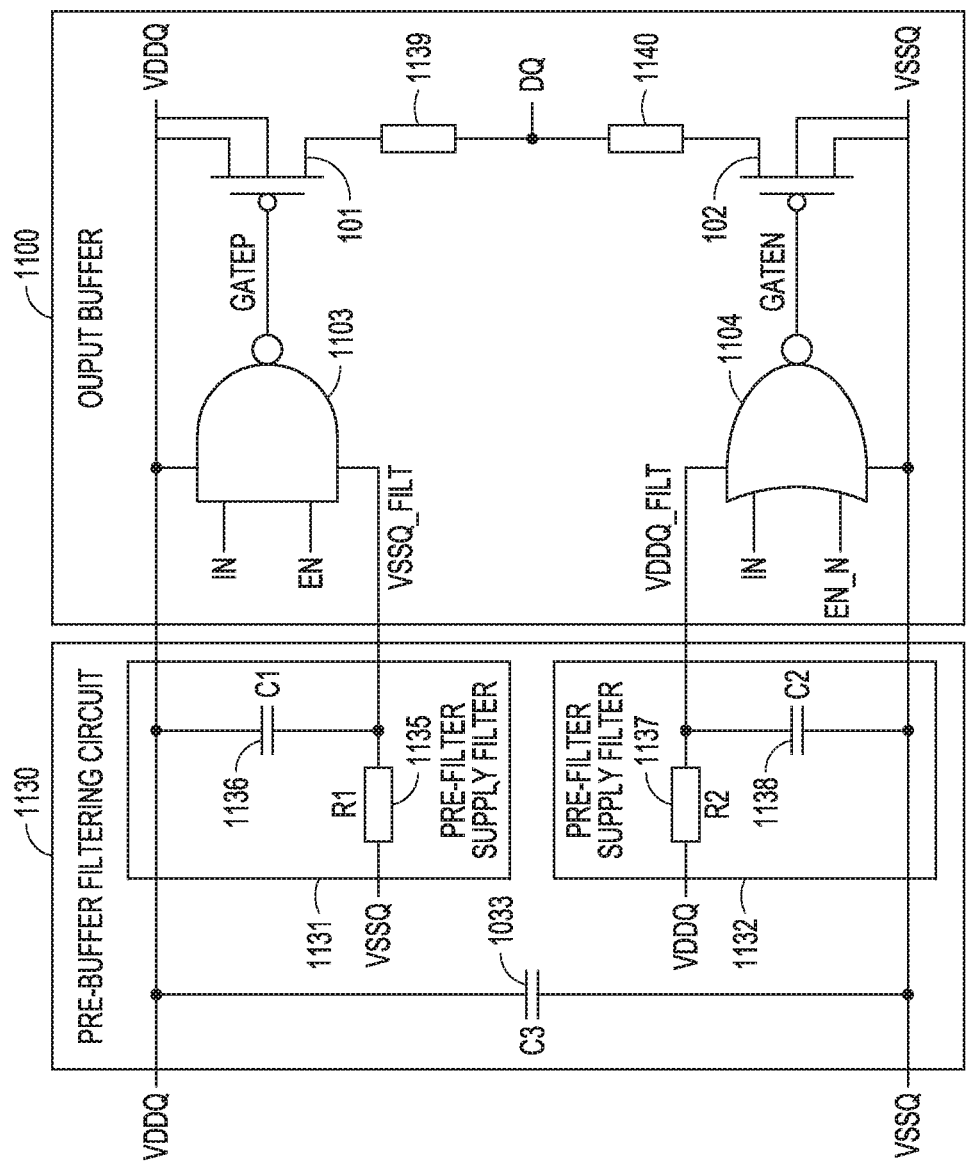
FIG. 11 is a circuit diagram illustrating an example of an output buffer and a pre-buffer filtering circuit.

FIG. 11 is a circuit diagram illustrating an example of an output buffer 1100 and a pre-buffer filtering circuit 1130. In various embodiments, output buffer 1100 and pre-buffer filtering circuit 1130 can be part of an electronic device such as a memory device. Output buffer 1100 can present an implementation example of output buffer 1000. Pre-buffer filtering circuit 1130 can represent an implementation example of pre-buffer filtering circuit 1030.

The portions of the electronic device illustrated in FIG. 11 includes a VDDQ node, a VSSQ node, pre-buffer supply filtering circuit 1130, and output buffer 1100. VDDQ and VSSQ refer to VDD (drain supply voltage) and VSS (source supply voltage), respectively, for the output stage of the electronic device that can be the same as or different from the VDD and VSS for other stages of the electronic device.

Pre-buffer supply filtering circuit 1131 includes a filtered VDDQ (VDDQ_FILT) node, a filtered VSSQ (VSSQ_FILT) node, supply capacitor 1033 (C3) coupled between the VDDQ node and the VSSQ node, a pre-buffer supply filter 1131 to produce the VSSQ_FILT, and a pre-buffer supply filter 1132 to produce the VDDQ_FILT. Pre-buffer supply filter 1131 can represent an example of pre-buffer supply filter 1031 and includes a filter resistor 1135 (R1) coupled between the VSSQ node and the VSSQ_FILT node and a filter capacitor 1136 (C1) coupled between the VDDQ node and the VSSQ_FILT node. Pre-buffer supply filter 1132 can represent an example of pre-buffer supply filter 1032 and includes a filter resistor 1137 (R2) coupled between the VDDQ node and the VDDQ_FILT node and a filter capacitor 1138 (C2) coupled between the VSSQ node and the VDDQ_FILT node.

Output buffer 1100 is coupled between the VDDQ node and the VSSQ node and includes a data input (IN) node, a data output (DQ) node, final PMOS transistor 101, final NMOS transistor 102, a NAND gate 1103, and a NOR gate 1104. PMOS transistor 101 has a PMOS source coupled to the VDDQ node, a PMOS drain coupled to the DQ node, and a PMOS gate. NMOS transistor 102 has an NMOS source coupled to the VSSQ node, an NMOS drain coupled to the DQ node, and an NMOS gate. Optionally, as illustrated in FIG. 11, output buffer 1100 can include a PMOS output resistor 1139 and an NMOS output resistor 1140. PMOS output resistor 1139 can be coupled between the PMOS drain and the DQ node, and NMOS output resistor 1140 can be coupled between the NMOS drain and the DQ node, for linearizing an output resistance of output buffer. NAND gate 1103 can represent an example of pre-buffer 1003 and is coupled between the VDDQ node and the VSSQ_FILT node to be powered using the VDDQ and the VSSQ_FILT, and coupled between the IN node and the PMOS gate to drive PMOS transistor 101 using an input data signal when being enabled. NAND gate 1103 has a NAND gate data input coupled to the IN node to receive the input data signal, a NAND gate enable input to receive an enable signal (EN), and a NAND gate output coupled to the PMOS gate. NOR gate 1104 can represent an example of pre-buffer 1004 and is coupled between the VDDQ_FILT node and the VSSQ node to be powered using the VDDQ_FILT and the VSSQ, and coupled between the IN node and the NMOS gate to drive NMOS transistor 102 using the input data signal when being enabled. NOR gate 1104 has a NOR gate data input coupled to the IN node to receive the input data signal, a NOR gate enable input to receive a disable signal (EN_N, complementary to EN), and a NOR gate output coupled to the NMOS gate.

Capacitors 1136 and 1138 have capacitances C1 and C2, respectively, that are determined based on the gate capacitance values of PMOS transistor 101 and NMOS transistor 102. In various embodiments, C1 and C2 can have difference values because the final PMOS and NMOS transistors have different gate capacitance values. Pre-buffer supply filters 1131 and 1132 can have the same cut-off frequencies. Thus, Resistors 1135 and 1137 have resistances R1 and R2, respectively, that are determined for R1·C1=R2·C2. Values of C1, R1, C2, R2, and C3 can be determined with aid of simulations.

Figure 12:
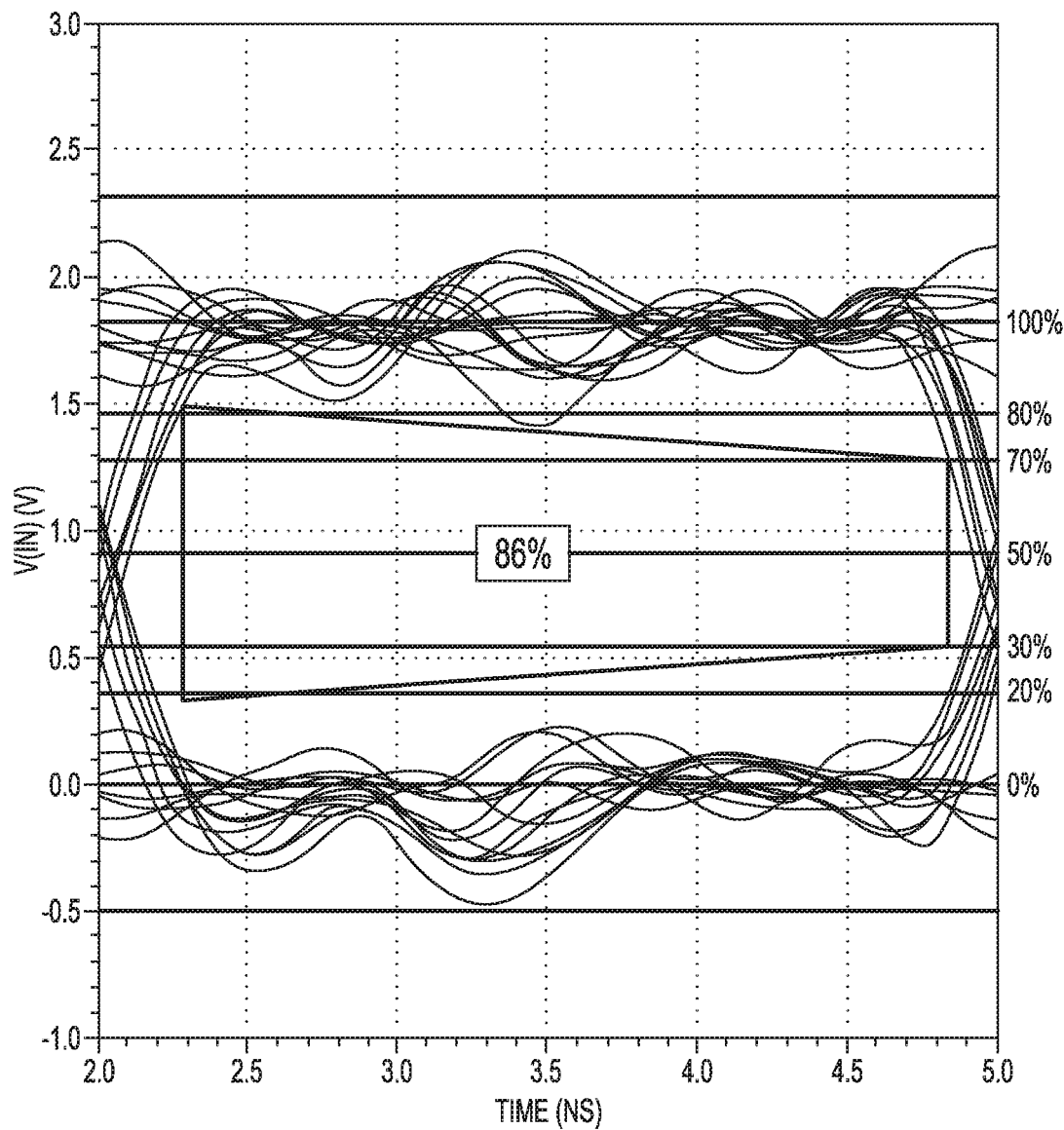
FIG. 12 is a graph showing an example of an eye-diagram of the voltage outputs from multiple output buffers, resulting from the simulation using the circuit of FIG. 4 but with the multiple output buffers each including the pre-buffer filtering circuit of FIG. 11.

FIG. 12 is a graph showing an example of an eye-diagram of V(IN) resulting from the simulation using circuit 410 and power supply 411, with 16 output buffers 400 each including output buffer 1100 and pre-buffer filtering circuit. Component values used in the simulations included C1=32 pF, R1=150 ohm, C2=16 pF, R2=300 ohm, and C3=52 pF. The simulation shows that the horizontal eye-opening percentage is 86%. Thus, comparing with the output buffers with C=100 pF without pre-buffer filters, pre-buffer filtering circuit 1130 improves the horizontal eye-opening percentage by 6% using the same total capacitance (i.e., C1+C2+C3=100 pF).

Thus, comparing to a single capacitor coupled between VDDQ and VSSQ, pre-buffer filtering circuit 1130 can provide for either higher horizontal eye-opening percentage using the same total capacitance or the same horizontal eye-opening percentage using a smaller total capacitance. In various embodiments, resistance and capacitance values for the pre-buffer filtering circuit can be adjusted based on the drain to source currents and gate capacitances of the final PMOS and NMOS transistors.

Figure 13:
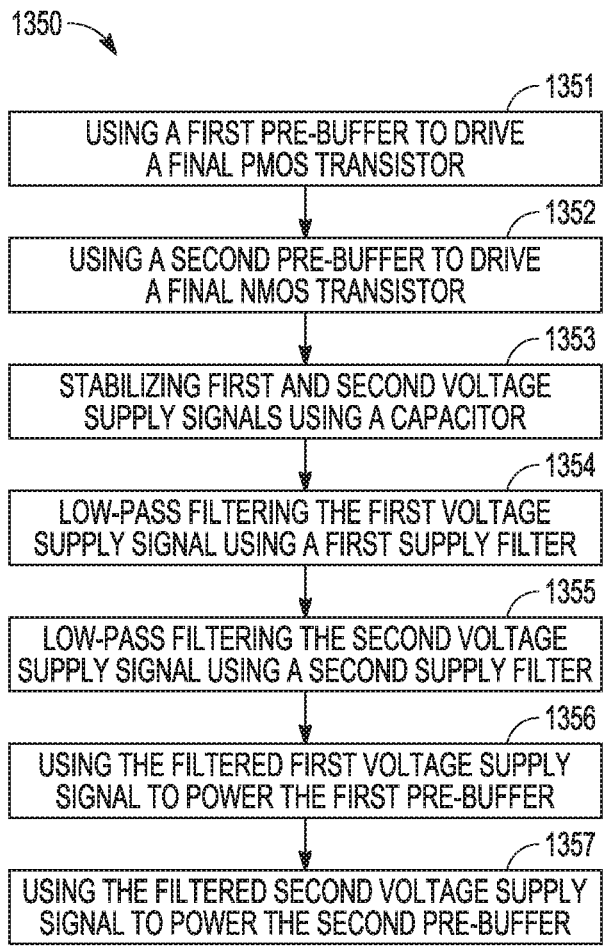
FIG. 13 is a flow chart illustrating an examples of a method for driving a pair of final p-channel metal oxide semiconductor (PMOS) and n-channel metal oxide semiconductor (NMOS) transistors in a data output stage of an electronic device.

FIG. 13 is a flow chart illustrating an example of a method 1350 for driving a pair of final PMOS and NMOS transistors in a data output stage of an electronic device. The pair of final PMOS and NMOS transistors are coupled between power supply lines carrying a first voltage supply signal and a second voltage supply signal. Method 1350 can be performed, for example, in an electronic device including output buffer 1000 and pre-buffer filtering circuit 1030.

At 1351, a first pre-buffer is used to drive the PMOS transistor. The first pre-buffer has a first pre-buffer data input to receive an input signal and a first pre-buffer output coupled to the gate of the PMOS transistor. At 1352, a second pre-buffer is used to drive the NMOS transistor. The second pre-buffer has a second pre-buffer data input to receive the input signal and a second pre-buffer output coupled to the gate of the NMOS transistor. In various embodiments, the electronic device includes a memory circuit, and the input signal is received from the memory circuit. Examples of the memory circuit include a DRAM circuit and a FeRAM circuit.

At 1353, the first and second voltage supply signals are stabilized by providing a supply capacitor coupled between the power supply lines carrying the first and second voltage supply signals.

At 1354, a first voltage supply signal is low-pass filtered using a first supply filter. At 1355, a second voltage supply signal is low-pass filtered using a second supply filter. In various embodiments, the first supply filter has a filtering circuit including a first filter resistor (R1) and a first filter capacitor (C1), and the second filtering circuit has a filtering circuit including a second filter resistor (R2) and a second filter capacitor (C2), Capacitance values of C1 and C2 can be determined based on gate capacitance values of the PMOS transistor and the NMOS transistor. Resistance values of R1 and R2 can be determined based on the determined capacitance values of C1 and C2, respectively, and the desired cut-off frequency of the first and second supply filters.

At 1356, the filtered first voltage supply signal is used to power the first pre-buffer. At 1357, the filtered second voltage supply signal is used to power the second pre-buffer. In one embodiment in which the electronic device includes multiple output buffers each including a pair of the first and second pre-buffers, multiple pairs of the first and second supply filters are provided. The filtered first voltage supply signal produced by each first supply filter is used to power a single first pre-buffer of the multiple output buffers, and the filtered second voltage supply signal produced by each second supply filter is used to power a single second pre-buffers of the multiple output buffers. In another embodiment in which the electronic device includes multiple output buffers each including a pair of the first and second pre-buffers, one or more pairs of the first and second supply filters are provided. The filtered first voltage supply signal produced by each first supply filter is used to power two or more first pre-buffers of the multiple output buffers, and the filtered second voltage supply signal produced by each second supply filter is used to power two or more second pre-buffers of the multiple output buffers. In yet another embodiment in which the electronic device includes multiple output buffers each including a pair of the first and second pre-buffers, a single pair of the first and second supply filters is provided. The filtered first voltage supply signal produced by the first supply filter is used to power all the first pre-buffers of the multiple output buffers, and the filtered second voltage supply signal produced by the second supply filter is used to power all the second pre-buffers of the multiple output buffers.

In various embodiments, the first voltage supply signal is an output stage source supply voltage (VSSQ) signal, and the second voltage supply signal is an output stage drain supply voltage (VDDQ) signal. Low-pass filtering the first voltage supply includes low-pass filtering the VSSQ signal, and low-pass filtering the second voltage supply includes low-pass filtering the VDDQ signal. The first pre-buffer is powered using the VDDQ signal and the filtered VSSQ signal, and the second pre-buffer is powered using the filtered VDDQ signal and the VSSQ signal.

Figure 14:
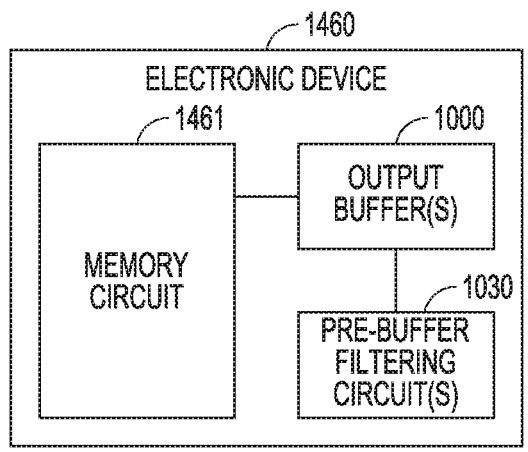
FIG. 14 is a block diagram illustrating an example of an electronic device including the output buffer and pre-buffer filtering circuit of FIG. 10.

FIG. 14 is a block diagram illustrating an example of an electronic device 1460 including a memory circuit 1462, one or more output buffers 1000, and one or more pre-buffer filtering circuits 1030. In various embodiments, electronic device 1460 is a memory device, such as a DRAM device or a FeRAM device. Output buffers 1000 can be used, for example, to hold output data until they are read by a data receiver, thereby allowing multiple data outputs to be connected to a common data bus. Accuracy of the data received from the memory device depends on the integrity of the signals output from output buffers 1000.

The present subject matter provides for improvement of the signal integrity of output buffers 1000 and/or reduction of the circuit size for electronic device 1460. The improvement of the signal integrity allows electronic device 1460 to handle increased data rates.

For example, when compared to the technique of using a supply capacitor coupled between the VDDQ and VSSQ nodes, using pre-buffer filtering circuit 1030 can improve the signal integrity without requiring more total capacitance, or can provide the same signal integrity with less total capacitance. Capacitor(s) required for stabilizing the supply voltage signals can contribute to the overall physical size of electronic device 1460 significantly. Thus, the present subject matter can allow for higher speed operations of electronic device 1460 without increasing its physical size.

Some non-limiting examples (Examples 1-20) of the present subject matter are provided as follows:

In Example 1, an electronic device may include an output stage drain supply voltage (VDDQ) node to provide a VDDQ, an output stage source supply voltage (VSSQ) node to provide a VSSQ, and a pre-buffer supply filtering circuit, and one or more output buffers. The pre-buffer supply filtering circuit may include a supply capacitor coupled between the VDDQ node and the VSSQ node, a low-pass first supply filter configured to filter the VSSQ, and a low-pass second supply filter configured to filter the VDDQ. The one or more output buffers may each be coupled to the pre-buffer filtering circuit and may each include a data output, a final p-channel metal oxide semiconductor (PMOS) transistor, a final n-channel metal oxide semiconductor (NMOS) transistor, a first pre; buffer, and a second pre-buffer. The final PMOS transistor may include a PMOS source to receive the VDDQ, a PMOS drain coupled to the data output, and a PMOS gate. The final NMOS transistor may include an NMOS source to receive the VSSQ, an NMOS drain coupled to the data output, and an NMOS gate. The first pre-buffer may be configured to be powered using the VDDQ and the filtered VSSQ and coupled to the PMOS gate to drive the PMOS transistor. The second pre-buffer may be configured to be powered using the filtered VDDQ and the VSSQ and coupled to the NMOS gate to drive the NMOS transistor.

In Example 2, the subject matter of Example 1 may optionally be configured to include a memory device including the VDDQ node, the VSSQ node, the pre-buffer supply filtering circuit, and the one or more output buffers.

In Example 3, the subject matter of any one or any combination of Examples 1 and 2 may optionally be configured such that the one or more output buffers include a single output buffer coupled to the pre-buffer supply filtering circuit, and the memory device includes multiple sets of the single output buffer coupled to the pre-buffer supply filtering circuit.

In Example 4, the subject matter of any one or any combination of Examples 1 and 2 may optionally be configured such that the one or more output buffer include multiple output buffers coupled to the pre-buffer supply filtering circuit, and the memory device includes multiple sets of the multiple output buffers coupled to the pre-buffer supply filtering circuit.

In Example 5, the subject matter of Example 2 may optionally be configured such that the memory device includes a dynamic random access memory (DRAM) device.

In Example 6, the subject matter of Example 2 may optionally be configured such that the memory device includes a ferroelectric random access memory (FeRAM) device.

In Example 7, an electronic circuit may include an output stage drain supply voltage (VDDQ) node, an output stage source supply voltage (VSSQ) node, a pre-buffer supply filtering circuit, and one or more output buffers. The pre-buffer supply filtering circuit may include a supply capacitor coupled between the VDDQ node and the VSSQ node, a filtered VDDQ node, a filtered VSSQ node, a low-pass first supply filter coupled between the VSSQ node and the filtered VSSQ node, and a low-pass second supply filter coupled between the VDDQ node and the filtered VDDQ node. The one or more output buffers may each include a data input (IN) node, a data output (DQ) node, a final p-channel metal oxide semiconductor (PMOS) transistor, a final n-channel metal oxide semiconductor (NMOS) transistor, a first pre-buffer, and a second pre-buffer. The final PMOS transistor may include a PMOS source coupled to the VDDQ node, a PMOS drain coupled to the DQ node, and a PMOS gate. The final NMOS transistor may include an NMOS source coupled to the VSSQ node, an NMOS drain coupled to the DQ node, and an NMOS gate. The first pre-buffer may be coupled between the VDDQ node and the filtered VSSQ node to be powered and coupled between the IN node the PMOS gate to drive the PMOS transistor. The second pre-buffer may be coupled between the filtered VDDQ node and the VSSQ node to be powered and coupled between the IN node and the NMOS gate to drive the NMOS transistor.

In Example 8, the subject matter of Example 7 may optionally be configured such that the one or more output buffer include a single output buffer.

In Example 9, the subject matter of Example 7 may optionally be configured such that the one or more output buffer include multiple output buffers.

In Example 10, the subject matter of any one or any combination of Examples 7 to 9 may optionally be configured such that the first supply filter includes a first filter resistor (R1) coupled between the VSSQ node and the filtered VSSQ node and a first filter capacitor (C1) coupled between the VDDQ node and the filtered VSSQ node, and the second supply filter includes a second filter resistor (R2) coupled between the VDDQ node and the filtered VDDQ node, and a second filter capacitor (C2) coupled between the VSSQ node and the filtered VDDQ node.

In Example 11, the subject matter of any one or any combination of Examples 7 to 10 may optionally be configured such that the one or more output buffers each further include a PMOS output resistor coupled between the PMOS drain and the DQ node and an NMOS output resistor coupled between the NMOS drain and the DQ node.

In Example 12, the subject matter of any one or any combination of Examples 7 to 11 may optionally be configured to further include an enable signal (EN) and a disable signal (EN_N) node, and such that the first pre-buffer includes a NAND gate including a first pre-buffer data input coupled to the IN node, a first pre-buffer enable input coupled to the EN node, and a first pre-buffer output coupled to the PMOS gate, and the second pre-buffer comprises a NOR gate including a second pre-buffer data input coupled to the IN node, a second pre-buffer enable input coupled to the EN_N node, and a second pre-buffer output coupled to the NMOS gate.

In Example 13, the subject matter of any one or any combination of Examples 7 to 12 may optionally be configured to include a memory circuit coupled to the IN node. The memory circuit is configured to store data.

In Example 14, a method for driving a pair of final p-channel metal oxide semiconductor (PMOS) transistor and final n-channel metal oxide semiconductor (NMOS) transistor in a data output stage of an electronic device is provided. The method may include using a first pre-buffer to drive the PMOS transistor, the first pre-buffer having a first pre-buffer data input to receive an input signal and a first pre-buffer output coupled to the gate of the PMOS transistor, using a second pre-buffer to drive the NMOS transistor, the second pre-buffer having a second pre-buffer data input to receive the input signal and a second pre-buffer output coupled to the gate of the NMOS transistor, low-pass filtering a first voltage supply signal using a first supply filter, using the filtered first voltage supply signal to power the first pre-buffer, low-pass filtering a second voltage supply signal using a second supply filter, using the filtered second voltage supply signal to power the second pre-buffer, and providing a supply capacitor coupled between power supply lines carrying the first voltage supply signal and the second voltage supply signal.

In Example 15, the subject matter of Example 14 may optionally further include powering the first pre-buffer using an output stage drain supply voltage (MIX)) signal and a filtered output stage source supply voltage (VSSQ) signal and powering the second pre-buffer using a filtered VDDQ signal and the VSSQ signal, the subject matter of low-pass filtering the first voltage supply as found in Example 14 may optionally include low-pass filtering the VSSQ signal, and the subject matter of low-pass filtering the second voltage supply as found in Example 14 may optionally include low-pass filtering the VDDQ signal.

In Example 16, the subject matter of using the first supply filter as found in any one or any combination of Examples 14 and 15 may optionally include using a filtering circuit including a first filter resistor (R1) and a first filter capacitor (C1), the subject matter of using the second supply filter as found in any one or any combination of Examples 14 and 15 may optionally include using a filtering circuit including a second filter resistor second filter capacitor (C2).

In Example 17, the subject matter of Example 16 may optionally further include determining capacitance values for the first filter capacitor and the second filter capacitor based on gate capacitance values of the PMOS transistor and the NMOS transistor.

In Example 1.8, the subject matter of any one or any combination of Examples 14 to 17 may optionally further include receiving the input signal from a memory circuit.

In Example 19, the subject matter of receiving the input signal from a memory circuit as found in Example 18 may optionally include receiving the input signal from a dynamic random access memory (DRAM) circuit or a ferroelectric random access memory (FeRAM) circuit.

In Example 20, the subject matter of any one or any combination of Examples 14 to 19 may optionally further include powering multiple pairs of the first pre-buffer and the second pre-buffer, which includes using the filtered first voltage supply signal to power multiple first pre-buffers of the multiple pairs of the first pre-buffer and the second pre-buffer and using the filtered second voltage supply signal to power multiple second pre-buffers of the multiple pairs of the first pre-buffer and the second pre-buffer.\

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. 1*t* is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic device, comprising:
   an output stage drain supply voltage (VDDQ) node to provide a VDDQ;
   an output stage source supply voltage (VSSQ) node to provide a VSSQ;
   a pre-buffer supply filtering circuit including:
      a supply capacitor coupled between the VDDQ node and the VSSQ node;
      a low-pass first supply filter configured to filter the VSSQ; and
      a low-pass second supply filter configured to filter the VDDQ; and
   one or more output buffers each coupled to the pre-buffer filtering circuit and each including:
      a data output;
      a final p-channel metal oxide semiconductor (PMOS) transistor including a PMOS source to receive the VDDQ, a PMOS drain coupled to the data output, and a PMOS gate;
      a final n-channel metal oxide semiconductor (NMOS) transistor including an NMOS source to receive the VSSQ, an NMOS drain coupled to the data output, and an NMOS gate;
      a first pre-buffer configured to be powered using the VDDQ and the filtered VSSQ and coupled to the PMOS gate to drive the PMOS transistor; and
      a second pre-buffer configured to be powered using the filtered VDDQ and the VSSQ and coupled to the NMOS gate to drive the NMOS transistor.

2. The electronic device of claim 1, comprising a memory device including the VDDQ node, the VSSQ node, the pre-buffer supply filtering circuit, and the one or more output buffers.

3. The electronic device of claim 2, wherein the one or more output buffers comprise a single output buffer coupled to the pre-buffer supply filtering circuit, and the memory device comprises multiple sets of the single output buffer coupled to the pre-buffer supply filtering circuit.

4. The electronic device of claim 2, wherein the one or more output buffers comprise multiple output buffers coupled to the pre-buffer supply filtering circuit, and the memory device comprises multiple sets of the multiple output buffers coupled to the pre-buffer supply filtering circuit.

5. The electronic device of claim 2, wherein the memory device comprises a dynamic random access memory (DRAM) device.

6. The electronic device of claim 2, wherein the memory device comprises a ferroelectric random access memory (FeRAM) device.

7. An electronic circuit, comprising:
   an output stage drain supply voltage (VDDQ) node;
   an output stage source supply voltage (VSSQ) node;
   a pre-buffer supply filtering circuit including:
      a supply capacitor coupled between the VDDQ node and the VSSQ node;
      a filtered VDDQ node;
      a filtered VSSQ node;
      a low-pass first supply filter coupled between the VSSQ node and the filtered VSSQ node; and
      a low-pass second supply filter coupled between the VDDQ node and the filtered VDDQ node; and
   one or more output buffers each including:
      a data input (IN) node;
      a data output (DQ) node;
      a final p-channel metal oxide semiconductor (PMOS) transistor including a PMOS source coupled to the VDDQ node, a PMOS drain coupled to the DQ node, and a PMOS gate;
      a final n-channel metal oxide semiconductor (NMOS) transistor including an NMOS source coupled to the VSSQ node, an NMOS drain coupled to the DQ node, and an NMOS gate;
      a first pre-buffer coupled between the VDDQ node and the filtered VSSQ node to be powered and coupled between the IN node the PMOS gate to drive the PMOS transistor; and
      a second pre-buffer coupled between the filtered VDDQ node and the VSSQ node to be powered and coupled between the IN node and the NMOS gate to drive the NMOS transistor.

8. The electronic circuit of claim 7, wherein the one or more output buffers comprise a single output buffer.

9. The electronic circuit of claim 7, wherein the one or more output buffers comprise multiple output buffers.

10. The electronic circuit of claim 7, wherein the first supply filter comprises:
   a first filter resistor (R1) coupled between the VSSQ node and the filtered VSSQ node; and
   a first filter capacitor (C1) coupled between the VDDQ node and the filtered VSSQ node,
and the second supply filter comprises:
   a second filter resistor (R2) coupled between the VDDQ node and the filtered VDDQ node; and
   a second filter capacitor (C2) coupled between the VSSQ node and the filtered VDDQ node.

11. The electronic circuit of claim 7, wherein the one or more output buffers each further comprise:
   a PMOS output resistor coupled between the PMOS drain and the DQ node; and
   an NMOS output resistor coupled between the NMOS drain and the DQ node.

12. The electronic circuit of claim 7, further comprising an enable signal (EN) node and a disable signal (EN_N) node, wherein the first pre-buffer comprises a NAND gate including:
   a first pre-buffer data input coupled to the IN node;
   a first pre-buffer enable input coupled to the EN node; and
   a first pre-buffer output coupled to the PMOS gate, and the second pre-buffer comprises a NOR gate including:
   a second pre-buffer data input coupled to the IN node;
   a second pre-buffer enable input coupled to the EN_N node; and
   a second pre-buffer output coupled to the NMOS gate.

13. The electronic circuit of claim 7, further comprising a memory circuit coupled to the IN node, the memory circuit configured to store data.

14. A method for driving a pair of final p-channel metal oxide semiconductor (PMOS) transistor and final n-channel metal oxide semiconductor (NMOS) transistor in a data output stage of an electronic device, the method comprising:
   using a first pre-buffer to drive the PMOS transistor, the first pre-buffer having a first pre-buffer data input to receive an input signal and a first pre-buffer output coupled to the gate of the PMOS transistor;
   using a second pre-buffer to drive the NMOS transistor, the second pre-buffer having a second pre-buffer data input to receive the input signal and a second pre-buffer output coupled to the gate of the NMOS transistor;
   low-pass filtering a first voltage supply signal using a first supply filter;
   using the filtered first voltage supply signal to power the first pre-buffer;
   low-pass filtering a second voltage supply signal using a second supply filter;
   using the filtered second voltage supply signal to power the second pre-buffer; and
   providing a supply capacitor coupled between power supply lines carrying the first voltage supply signal and the second voltage supply signal.

15. The method of claim 14, further comprising:
   powering the first pre-buffer using an output stage drain supply voltage (VDDQ) signal and a filtered output stage source supply voltage (VSSQ) signal, wherein low-pass filtering the first voltage supply includes low-pass filtering the VSSQ signal; and
   powering the second pre-buffer using a filtered VDDQ signal and the VSSQ signal, wherein low-pass filtering the second voltage supply includes low-pass filtering the VDDQ signal.

16. The method of claim 15, wherein using the first supply filter comprises using a filtering circuit including a first filter resistor (R1) and a first filter capacitor (C1), and using the second supply filter comprises using a filtering circuit including a second filter resistor (R2) and a second filter capacitor (C2).

17. The method of claim 16, further comprising determining capacitance values for the first filter capacitor and the second filter capacitor based on gate capacitance values of the PMOS transistor and the NMOS transistor.

18. The method of claim 14, further comprising receiving the input signal from a memory circuit.

19. The method of claim 18, wherein receiving the input signal from the memory circuit comprises receiving the input signal from a dynamic random access memory (DRAM) circuit or a ferroelectric random access memory (FeRAM) circuit.

20. The method of claim 18, further comprising powering multiple pairs of the first pre-buffer and the second pre-buffer, including:
   using the filtered first voltage supply signal to power multiple first pre-buffers of the multiple pairs of the first pre-buffer and the second pre-buffer; and
   using the filtered second voltage supply signal to power multiple second pre-buffers of the multiple pairs of the first pre-buffer and the second pre-buffer.

* * * * *